(12) United States Patent
Zhan

(10) Patent No.: US 11,315,356 B2
(45) Date of Patent: Apr. 26, 2022

(54) ORGANIC LIGHT EMITTING DIODE DISPLAY PANEL MODULE

(71) Applicant: WUHAN CHINA STAR OPTOELECTRONICS SEMICONDUCTOR DISPLAY TECHNOLOGY CO., LTD., Hubei (CN)

(72) Inventor: Dong Zhan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 434 days.

(21) Appl. No.: 16/478,044

(22) PCT Filed: Mar. 14, 2019

(86) PCT No.: PCT/CN2019/078136
§ 371 (c)(1),
(2) Date: Jul. 15, 2019

(87) PCT Pub. No.: WO2020/155321
PCT Pub. Date: Aug. 6, 2020

(65) Prior Publication Data
US 2021/0357602 A1 Nov. 18, 2021

(30) Foreign Application Priority Data

Jan. 31, 2019 (CN) .......................... 201910095238.X

(51) Int. Cl.
*H01L 27/32* (2006.01)
*G06V 40/13* (2022.01)
*G10K 11/162* (2006.01)

(52) U.S. Cl.
CPC ...... *G06V 40/1306* (2022.01); *H01L 27/3234* (2013.01); *H01L 27/3244* (2013.01); *G10K 11/162* (2013.01)

(58) Field of Classification Search
CPC .............. G06K 9/0002; H01L 27/3234; H01L 27/3244; H01L 27/323; H01L 41/047; G10K 11/162; H04M 1/0266; G01S 1/72
See application file for complete search history.

(56) References Cited

U.S. PATENT DOCUMENTS

2015/0165479 A1 6/2015 Lasiter et al.
2015/0169136 A1 6/2015 Ganti et al.
(Continued)

FOREIGN PATENT DOCUMENTS

CN 105980968 A 9/2016
CN 106951887 A 7/2017

*Primary Examiner* — Abdul-Samad A Adediran

(57) ABSTRACT

An organic light emitting diode (OLED) display panel module includes a cover plate, a first adhesive agent, a circular polarizer, an OLED display panel, and an ultrasonic fingerprint recognition module. The ultrasonic fingerprint recognition module is disposed at a lower surface of the OLED display panel. Both sides of the OLED display panel module are provided with a sound absorbing layer, both sides of the ultrasonic fingerprint recognition module are provided with the sound absorbing layer, and a portion of the lower surface of the OLED display panel not contacted the ultrasonic fingerprint recognition module is provided with the sound absorbing layer.

16 Claims, 2 Drawing Sheets

(56) References Cited

U.S. PATENT DOCUMENTS

| | | |
|---|---|---|
| 2017/0098110 A1 | 4/2017 | Kim et al. |
| 2017/0364726 A1* | 12/2017 | Buchan ................. H01L 41/047 |
| 2018/0151641 A1* | 5/2018 | Choo .................... H01L 27/323 |
| 2018/0373913 A1 | 12/2018 | Panchawagh et al. |
| 2019/0251378 A1* | 8/2019 | Jung ......................... G01S 1/72 |
| 2020/0194516 A1* | 6/2020 | Kim .................... H04M 1/0266 |

* cited by examiner

ORGANIC LIGHT EMITTING DIODE DISPLAY PANEL MODULE

BACKGROUND OF INVENTION

Field of Invention

The present invention relates to a field of display technology, more particularly, to an organic light emitting diode (OLED) display panel module.

Description of Prior Art

Currently, in order to achieve a high screen ratio, a home key is virtualized and a screen wake up is generally set in a display area, and a screen is unlocked by an optical fingerprint method. However, optical fingerprint unlocking has following problems: lower security and inability to distinguish a biological living body if someone copies fingerprint information. The optical fingerprint unlocking does not meet user needs who are concerned about private information and unlocking tool security. In addition, the optical fingerprint recognition demands optical signals, for example, clean fingers and reflectance, transmittance, and brightness of optical properties of a display panel can affect recognition effect, which leads to bad user experience.

Accordingly, traditional organic light emitting diode (OLED) display panel modules adopt screen finger recognition technology, and signal anti-interference is poor and attenuation during signal propagation is strong, so a screen's recognition success rate for recognition modules is affected.

SUMMARY OF INVENTION

Accordingly, traditional organic light emitting diode (OLED) display panel modules adopt screen finger recognition technology, and the signal anti-interference is poor and the attenuation during signal propagation is strong, so recognition success rate screen for recognition modules is affected.

An OLED display panel module is provided. It can improve ultrasonic transmission efficiency of screen ultrasonic recognition module. Therefore, the problem, for example, the signal anti-interference is poor and the attenuation during signal propagation is strong because traditional organic light emitting diode (OLED) display panel modules adopt screen finger recognition technology, is solved, recognition success rate screen for recognition modules is improved.

In order to solve above problems, technical solutions are described as follows:

An organic light emitting diode display panel module includes a cover plate, a first adhesive agent, a circular polarizer, an OLED display panel, and an ultrasonic fingerprint recognition module disposed in order from top to bottom. The ultrasonic fingerprint recognition module is disposed at a lower surface of the OLED display panel. The lower surface of the OLED display panel has a first region and a second region, the first region contacts the ultrasonic fingerprint recognition module, and a second region does not contact the ultrasonic fingerprint recognition module. A sound absorbing layer is disposed on both sides of the OLED display panel module, both sides of the ultrasonic fingerprint recognition module, and the second region of the lower surface of the OLED display panel. The first adhesive agent is a solid optically clear adhesive (OCA), and the sound absorbing layer is a sound absorbing tile, and material of the sound absorbing tile includes any one of polymerized styrene butadiene rubber, polyurethane, glass fiber, polysulfide rubber, and silica gel.

In one embodiment, the ultrasonic fingerprint recognition module comprises an ultrasonic recognition sensor, and the ultrasonic recognition sensor is capable of transmitting ultrasonic waves at a certain frequency.

In one embodiment, a resistance of the sound absorbing layer matches a frequency corresponding to the ultrasonic waves emitted by the ultrasonic recognition sensor.

In one embodiment, the lower surface of the OLED display panel is attached to an upper surface of the ultrasonic fingerprint recognition module, the both sides of the ultrasonic fingerprint recognition module are respectively embedded in a backplate and an inside of a first foam layer through a second adhesive agent, and the lower surface of the ultrasonic fingerprint recognition module is attached to a second foam layer.

In one embodiment, upper and lower surfaces of the first foam layer and upper and lower surfaces of the second foam layer are provided with the sound absorbing layer, and the first foam layer and the second foam layer are all closed cell foams.

In one embodiment, the second adhesive agent includes any one of ultraviolet curing adhesive, rubber, silica gel and glass glue, and a colloid of the second adhesive agent is presented as an inverted trapezoid, and a contact angle of the colloid of the second adhesive agent with the lower surface of the OLED display panel is greater than 90°.

In one embodiment, a contact portion between the both sides of the ultrasonic fingerprint recognition module and the colloid of the second adhesive agent is provided with a concave-convex structure.

In one embodiment, the OLED display panel includes a thin film transistor (TFT) array substrate, an OLED light emitting layer, an anode metal layer, a cathode metal layer, and a packaging layer. The ultrasonic fingerprint recognition module includes an ultrasonic recognition sensor, and the ultrasonic recognition sensor vertically overlaps with upper and lower positions of a planar layer of the TFT array substrate spatially.

In one embodiment, a sensing surface of the ultrasonic recognition sensor is a full-surface type, and the ultrasonic recognition sensor is attached to the lower surface of the OLED display panel, and two adjacent ultrasonic recognition sensors are connected by the sound absorbing layer.

In other embodiment, an organic light emitting diode display panel module includes a cover plate, a first adhesive agent, a circular polarizer, an OLED display panel, and an ultrasonic fingerprint recognition module disposed in order from top to bottom. The ultrasonic fingerprint recognition module is disposed at a lower surface of the OLED display panel. The lower surface of the OLED display panel has a first region and a second region, the first region contacts the ultrasonic fingerprint recognition module, and a second region does not contact the ultrasonic fingerprint recognition module. A sound absorbing layer is disposed on both sides of the OLED display panel module, both sides of the ultrasonic fingerprint recognition module, and the second region of the lower surface of the OLED display panel.

In one embodiment, the ultrasonic fingerprint recognition module includes an ultrasonic recognition sensor, and the ultrasonic recognition sensor is capable of transmitting ultrasonic waves at a certain frequency.

In one embodiment, a resistance of the sound absorbing layer matches a frequency corresponding to the ultrasonic waves emitted by the ultrasonic recognition sensor.

In one embodiment, the lower surface of the OLED display panel is attached to an upper surface of the ultrasonic fingerprint recognition module, the both sides of the ultrasonic fingerprint recognition module are respectively embedded in a backplate and an inside of a first foam layer through a second adhesive agent, and the lower surface of the ultrasonic fingerprint recognition module is attached to a second foam layer.

In one embodiment, upper and lower surfaces of the first foam layer and upper and lower surfaces of the second foam layer are provided with the sound absorbing layer, and the first foam layer and the second foam layer are all closed cell foams.

In one embodiment, the second adhesive agent includes any one of ultraviolet curing adhesive, rubber, silica gel and glass glue, and a colloid of the second adhesive agent is presented as an inverted trapezoid, and a contact angle of the colloid of the second adhesive agent with the lower surface of the OLED display panel is greater than 90°.

In one embodiment, a contact portion between the both sides of the ultrasonic fingerprint recognition module and the colloid of the second adhesive agent is provided with a concave-convex structure.

In one embodiment, the OLED display panel includes a thin film transistor (TFT) array substrate, an OLED light emitting layer, an anode metal layer, a cathode metal layer, and a packaging layer. The ultrasonic fingerprint recognition module includes an ultrasonic recognition sensor, and the ultrasonic recognition sensor vertically overlaps with upper and lower positions of a planar layer of the TFT array substrate spatially.

In one embodiment, a sensing surface of the ultrasonic recognition sensor is a full-surface type, and the ultrasonic recognition sensor is attached to the lower surface of the OLED display panel, and two adjacent ultrasonic recognition sensors are connected by the sound absorbing layer.

The OLED display panel module has beneficial effects, for example, both sides of ultrasonic fingerprint recognition module and both sides of the OLED display panel module are provided with the sound absorbing layer, and thus signal anti-interference ability of the ultrasonic fingerprint recognition module is enhanced, so the transmission efficiency of the ultrasonic fingerprint recognition module is further improved.

BRIEF DESCRIPTION OF DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

DETAILED DESCRIPTION OF PREFERRED EMBODIMENTS

Figure 1:
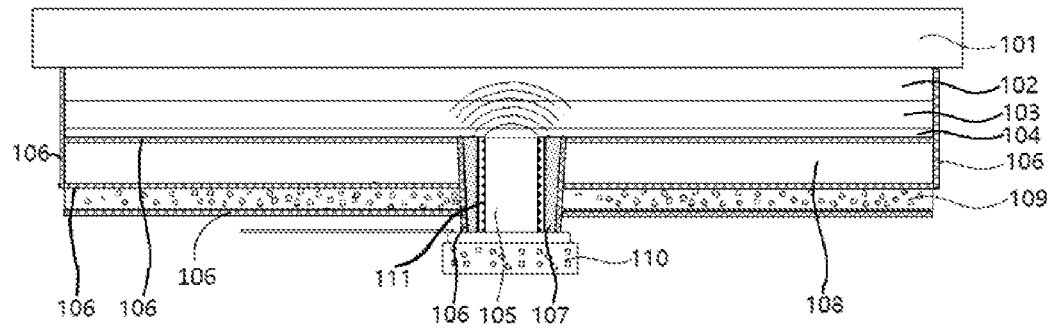
FIG. 1 is a cross sectional structural view of an organic light emitting diode (OLED) display panel module according to a first embodiment of the present invention.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

FIRST EMBODIMENT

Referring to FIG. 1, which is a cross sectional structural view of an organic light emitting diode (OLED) display panel module according to a first embodiment of the present invention. An OLED display panel module includes a cover plate 101, a first adhesive agent 102, a circular polarizer 103, an OLED display panel 104, and an ultrasonic fingerprint recognition module 105 disposed in order from top to bottom. The ultrasonic fingerprint recognition module 105 is disposed at a lower surface of the OLED display panel 104. The lower surface of the OLED display panel 104 has a first region and a second region, the first region contacts the ultrasonic fingerprint recognition module 105, and a second region does not contact the ultrasonic fingerprint recognition module 105. A sound absorbing layer 106 is disposed on both sides of the OLED display panel module are provided with a sound absorbing layer 106, both sides of ultrasonic fingerprint recognition module 105, and the second region of the lower surface of the OLED display panel 104.

Specifically, the lower surface of the OLED display panel 104 is attached to an upper surface of the ultrasonic fingerprint recognition module 105, the both sides of the ultrasonic fingerprint recognition module 105 are respectively embedded in a backplate 108 and an inside of a first foam layer through a second adhesive agent 107, and the lower surface of the ultrasonic fingerprint recognition module 105 is attached to a second foam layer 110.

Specifically, upper and lower surfaces of the first foam layer 109 and upper and lower surfaces of the second foam layer 110 are provided with the sound absorbing layer 106, and the first foam layer 109 and the second foam layer 110 are all closed cell foams.

The first adhesive agent 102 is a solid optically clear adhesive (OCA). The sound absorbing layer 106 adopts a sound absorbing tile material, such as a soft porous material including polymerized styrene butadiene rubber, polyurethane, glass fiber, polysulfide rubber, and silica gel, which are used in military submarines. The ultrasonic fingerprint recognition module 105 includes an ultrasonic recognition sensor, and the ultrasonic recognition sensor is capable of transmitting ultrasonic waves at a certain frequency. A resistance of the sound absorbing layer 106 matches a frequency corresponding to the ultrasonic waves emitted by the ultrasonic recognition sensor.

Specifically, the second adhesive agent 107 includes any one of ultraviolet curing adhesive, rubber, silica gel, and glass glue. A colloid of the second adhesive agent is presented as an inverted trapezoid, and a contact angle of the colloid of the second adhesive agent 107 with the lower surface of the OLED display panel 104 is greater than 90°.

Specifically, a contact portion a between the both sides of the ultrasonic fingerprint recognition module 105 and the colloid of the second adhesive agent 107 is provided with a concave-convex structure.

In the first embodiment, the ultrasonic fingerprint recognition module 105 of the OLED display panel modular adopts a modular unit, and the ultrasonic fingerprint recognition module 105 is embedded in the back side of the display module and attached to the lower surface of the OLED display panel 104 by a sealing method. There are no air bubbles and foreign objects between the ultrasonic fingerprint recognition module 105 and the OLED display panel 104. The second adhesive agent 107 is used for sealing in a negative pressure condition. A colloid of the second adhesive agent 107 is designed as an inverted trapezoid to ensure that a contact angle between the colloid of the second adhesive agent 107 and the OLED display panel 104 is greater than 90°. Meanwhile, a contact portion a between the both sides of the ultrasonic fingerprint recognition module 105 and the colloid of the second adhesive agent 107 is provided with a concave-convex structure 111. Therefore, the OLED display panel 104 is protected from stabbing caused by the ultrasonic fingerprint recognition module 105 disposed in the back side of the display module, and an adhesion strength is increased. There is no air between the ultrasonic fingerprint recognition module 105 and the OLED display panel 104. The first foam layer 109 adopting an all closed cell foam also can damp and filter interfering sound waves emitted by the back side of the display panel, such as a middle frame of mobile phone. In order to improve the display panel module, a second foam layer 110 is added to the back side of the ultrasonic fingerprint recognition module 105.

In the first embodiment, sides of the display panel module, the lower surface of the OLED display panel 104, sides of the ultrasonic fingerprint recognition module 105, the upper and lower surfaces of the first foam layer 109, and the upper and lower surfaces of the second foam layer 110 are coated or attached with sound absorbing materials. The main reason is that the ultrasonic waves can be reflected and transmitted in different directions within the display panel module. The ultrasonic signal can be transmitted from outside, such as the surroundings of the display panel, sides and a middle frame of a mobile phone, etc., to inside of the display panel module, so transmission, reception, and identification of the ultrasonic signal of the ultrasonic fingerprint recognition module are influenced. The sound absorbing layer 106 can filter out interference signals so as to absorb and muffle unnecessary ultrasonic waves within the display panel module. When sound waves pass through the sound absorbing layer 106, a part of the acoustic energy is rubbed in pores of the porous material to be converted into heat energy, and then the heat energy is dissipated, so that the sound waves passing through the muffler are attenuated. Sound absorbing is generally required to match the resistance, and the sound is absorbed and damped when the sound enters a medium. The sound absorbing materials generally have a sound absorbing sponge, a micro-perforated structure, etc. A common structure is a muffling sponge structure having internal wedges, and others having a resonant cavity structure with a damping function are also good.

Second Embodiment

Figure 2:
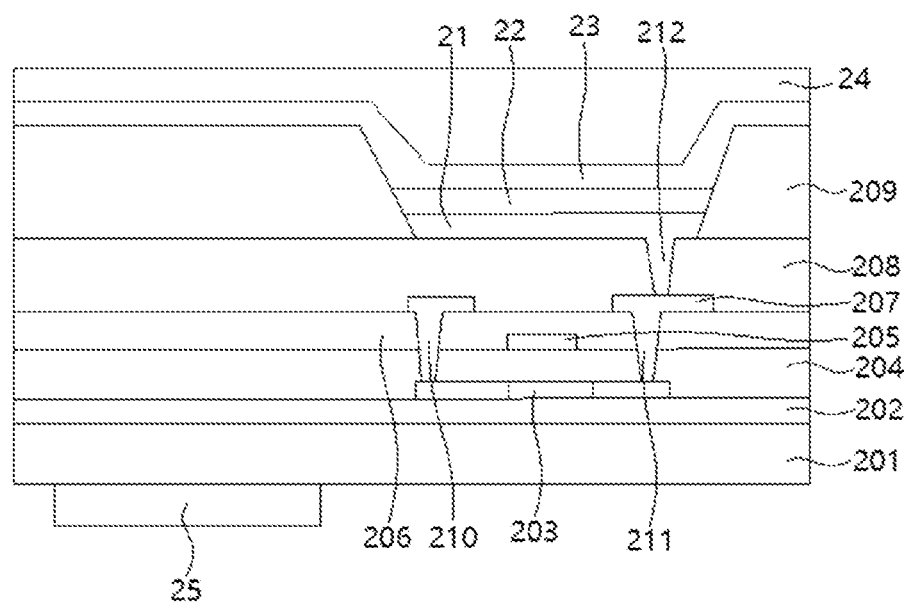
FIG. 2 is a cross sectional structural view of a part of the OLED display panel module according to a second embodiment of the present invention.

Referring to FIG. 2, which is a cross sectional structural view of a part of the OLED display panel module according to a second embodiment of the present invention. A difference from the first embodiment is merely that the ultrasonic fingerprint recognition module 25 is attached to a different position on the lower surface of the OLED display panel. The OLED display panel includes a thin film transistor (TFT) array substrate 20, an OLED light emitting layer 21, an anode metal layer 22, a cathode metal layer 23, and a packaging layer 24. The ultrasonic fingerprint recognition module 25 includes an ultrasonic recognition sensor, and the ultrasonic recognition sensor vertically overlaps with upper and lower positions of a planar layer 208 of the TFT array substrate spatially. That is, the attachment position of the top surface of the ultrasonic recognition sensor and the lower surface of the OLED display panel avoids a pixel opening area of the OLED display panel.

Specifically, the TFT array substrate 20 includes a flexible substrate 201, a buffer layer 202, an active layer 203, a gate insulating layer 204, a gate metal layer 205, an interlayer insulating layer 206, a source and drain metal layer 207, a planar layer 208, and pixel defining layer 209. The source and drain metal layer 207 is connected to the active layer 203 through a first through hole 210 and a second though hole 211. The anode metal layer 23 is connected to source and drain metal layer 207 through a third through hole.

In the OLED display panel module according to the second embodiment, the attachment position of the top surface of the ultrasonic recognition sensor and the lower surface of the OLED display panel avoids a pixel opening area of the OLED display panel, and thus the ultrasonic signal transmission efficiency in the OLED display panel is enhanced, and the ultrasonic signal dispersion and attenuation are also prevented.

Third Embodiment

Figure 3:
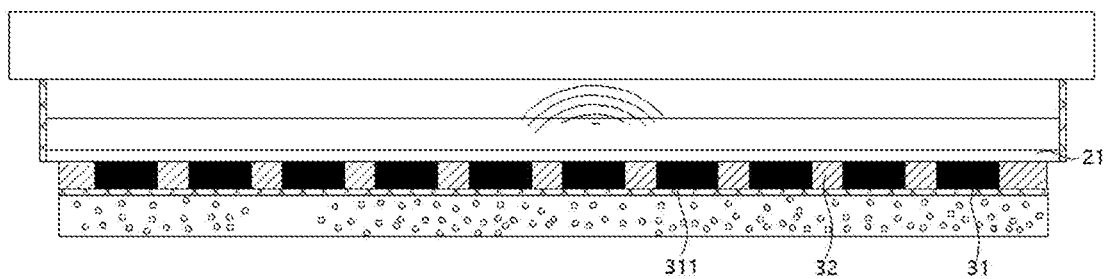
FIG. 3 is a cross sectional structural view of an OLED display panel module according to a third embodiment of the present invention.

Referring to FIG. 3, which is a cross sectional structural view of an organic light emitting diode (OLED) display panel module according to the third embodiment of the present invention. The third embodiment is different from the first embodiment and the second embodiment, and a difference is that an ultrasonic fingerprint recognition module 31 is attached to the OLED display panel module in a different way. The ultrasonic fingerprint recognition module 31 includes an ultrasonic recognition sensor 311. A sensing surface of the ultrasonic recognition sensor 311 is a full-surface type, and the ultrasonic recognition sensor 311 is attached to the lower surface of the OLED display panel 21, and two adjacent ultrasonic recognition sensors 311 are connected by the sound absorbing layer 32.

The OLED display panel module has beneficial effects, for example, both sides of ultrasonic fingerprint recognition module and both sides of the OLED display panel module are provided with the sound absorbing layer, and thus a signal anti-interference ability of the ultrasonic fingerprint recognition module is enhanced, so the transmission efficiency of the ultrasonic fingerprint recognition module is further improved.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An organic light emitting diode (OLED) display panel module, comprising: a cover plate, a first adhesive agent, a circular polarizer, an OLED display panel, and an ultrasonic fingerprint recognition module disposed in order from top to bottom;
    wherein the ultrasonic fingerprint recognition module is disposed at a lower surface of the OLED display panel, the lower surface of the OLED display panel has a first region and a second region, the first region contacts the ultrasonic fingerprint recognition module, and the second region does not contact the ultrasonic fingerprint recognition module;

wherein the lower surface of the OLED display panel is attached to an upper surface of the ultrasonic fingerprint recognition module, both sides of the ultrasonic fingerprint recognition module are respectively embedded in a backplate and an inside of a first foam layer through a second adhesive agent, and a lower surface of the ultrasonic fingerprint recognition module is attached to a second foam layer;

wherein a sound absorbing layer is disposed on both sides of the OLED display panel module, the both sides of the ultrasonic fingerprint recognition module, and the second region of the lower surface of the OLED display panel; and wherein the first adhesive agent is a solid optically clear adhesive (OCA), and the sound absorbing layer is a sound absorbing tile, and material of the sound absorbing tile comprises any one of polymerized styrene butadiene rubber, polyurethane, glass fiber, polysulfide rubber, and silica gel.

2. The OLED display panel module according to claim 1, wherein the ultrasonic fingerprint recognition module comprises an ultrasonic recognition sensor, and the ultrasonic recognition sensor is capable of transmitting ultrasonic waves at a certain frequency.

3. The OLED display panel module according to claim 2, wherein a resistance of the sound absorbing layer matches a frequency corresponding to the ultrasonic waves emitted by the ultrasonic recognition sensor.

4. The OLED display panel module according to claim 1, wherein upper and lower surfaces of the first foam layer and upper and lower surfaces of the second foam layer are provided with the sound absorbing layer, and the first foam layer and the second foam layer are all closed cell foams.

5. The OLED display panel module according to claim 1, wherein the second adhesive agent comprises any one of ultraviolet curing adhesive, rubber, silica gel, and glass glue; wherein a colloid of the second adhesive agent is presented as an inverted trapezoid, and a contact angle of the colloid of the second adhesive agent with the lower surface of the OLED display panel is greater than 90°.

6. The OLED display panel module according to claim 5, wherein a contact portion between the both sides of the ultrasonic fingerprint recognition module and the colloid of the second adhesive agent is provided with a concave-convex structure.

7. The OLED display panel module according to claim 1, wherein the OLED display panel comprises a thin film transistor (TFT) array substrate, an OLED light emitting layer, an anode metal layer, a cathode metal layer, and a packaging layer; and wherein the ultrasonic fingerprint recognition module comprises an ultrasonic recognition sensor, and the ultrasonic recognition sensor vertically overlaps with upper and lower positions of a planar layer of the TFT array substrate spatially.

8. The OLED display panel module according to claim 7, wherein a sensing surface of the ultrasonic recognition sensor is a full-surface type, and the ultrasonic recognition sensor is attached to the lower surface of the OLED display panel, and two adjacent ultrasonic recognition sensors are connected by the sound absorbing layer.

9. An organic light emitting diode display panel module, comprising: a cover plate, a first adhesive agent, a circular polarizer, an OLED display panel, and an ultrasonic fingerprint recognition module disposed in order from top to bottom;

wherein the ultrasonic fingerprint recognition module is disposed at a lower surface of the OLED display panel, the lower surface of the OLED display panel has a first region and a second region, the first region contacts to the ultrasonic fingerprint recognition module, and the second region does not contact to the ultrasonic fingerprint recognition module;

wherein the lower surface of the OLED display panel is attached to an upper surface of the ultrasonic fingerprint recognition module, both sides of the ultrasonic fingerprint recognition module are respectively embedded in a backplate and an inside of a first foam layer through a second adhesive agent, and a lower surface of the ultrasonic fingerprint recognition module is attached to a second foam layer; and wherein a sound absorbing layer is disposed on both sides of the OLED display panel module, both sides of the ultrasonic fingerprint recognition module, and the second region of the lower surface of the OLED display panel.

10. The OLED display panel module according to claim 9, wherein the ultrasonic fingerprint recognition module comprises an ultrasonic recognition sensor, and the ultrasonic recognition sensor is capable of transmitting ultrasonic waves at a certain frequency.

11. The OLED display panel module according to claim 10, wherein a resistance of the sound absorbing layer matches a frequency corresponding to the ultrasonic waves emitted by the ultrasonic recognition sensor.

12. The OLED display panel module according to claim 9, wherein upper and lower surfaces of the first foam layer and upper and lower surfaces of the second foam layer are provided with the sound absorbing layer, and the first foam layer and the second foam layer are all closed cell foams.

13. The OLED display panel module according to claim 9, wherein the second adhesive agent comprises any one of ultraviolet curing adhesive, rubber, silica gel, and glass glue; wherein a colloid of the second adhesive agent is presented as an inverted trapezoid, and a contact angle of the colloid of the second adhesive agent with the lower surface of the OLED display panel is greater than 90°.

14. The OLED display panel module according to claim 13, wherein a contact portion between the both sides of the ultrasonic fingerprint recognition module and the colloid of the second adhesive agent is provided with a concave-convex structure.

15. The OLED display panel module according to claim 9, wherein the OLED display panel comprises a thin film transistor (TFT) array substrate, an OLED light emitting layer, an anode metal layer, a cathode metal layer, and a packaging layer; and wherein the ultrasonic fingerprint recognition module comprises an ultrasonic recognition sensor, and the ultrasonic recognition sensor vertically overlaps with upper and lower positions of a planar layer of the TFT array substrate spatially.

16. The OLED display panel module according to claim 15, wherein a sensing surface of the ultrasonic recognition sensor is a full-surface type, and the ultrasonic recognition sensor is attached to the lower surface of the OLED display panel, and two adjacent ultrasonic recognition sensors are connected by the sound absorbing layer.

* * * * *